United States Patent [19]

Kim

[11] Patent Number: 5,499,131

[45] Date of Patent: Mar. 12, 1996

[54] LIQUID CRYSTAL DISPLAY

[75] Inventor: Young-whan Kim, Kyunggi-do, Rep. of Korea

[73] Assignee: Samsung Display Devices Co., Ltd., Kyunggi-do, Rep. of Korea

[21] Appl. No.: 205,017

[22] Filed: Mar. 1, 1994

[30] Foreign Application Priority Data

Jun. 21, 1993 [KR] Rep. of Korea ............... 1993-10977

[51] Int. Cl.$^6$ ............................................. G02F 1/1343
[52] U.S. Cl. ............................................. 359/88
[58] Field of Search ........................... 359/88, 87, 54

[56] References Cited

U.S. PATENT DOCUMENTS 4,838,656  6/1989  Stoddard ......................... 359/87

FOREIGN PATENT DOCUMENTS

| 0029985 | 6/1981 | European Pat. Off. . | |
|---|---|---|---|
| 5203997 | 8/1993 | Japan | 359/54 |
| 667191 | 3/1994 | Japan | 359/88 |

*Primary Examiner*—Willaim L. Sikes
*Assistant Examiner*—James A. Dudek
*Attorney, Agent, or Firm*—Christie, Parker & Hale

[57] ABSTRACT

A liquid crystal display including a pair of panels having a segment electrode and a common electrode respectively, a liquid crystal between the panels, a frit seal for sealing the panels, a pair of polarizers attached or stuck to outer surfaces for the panels respectively, and lead patterns connected to the electrodes, resistances of the lead patterns are uniform.

3 Claims, 2 Drawing Sheets

LIQUID CRYSTAL DISPLAY

BACKGROUND OF THE INVENTION

1. Field of the Invention

The present invention relates to a liquid crystal display (LCD) and, more particularly, to a LCD which can prevent a display error caused by a difference of lead pattern resistances.

2. Description of the Prior Art

Generally, a LCD can display a picture such as a letter, a number, and the like by using characteristic of twist and dispersion of liquid crystal under the effect of electric field and selecting light.

There are smectic liquid crystal, nematic liquid crystal, cholesteric liquid crystal and so forth, and nematic liquid crystal is widely used for information display.

The nematic liquid crystal can be classified twisted nematic (TN), super twisted nematic (STN), double super twisted nematic (DSTN) and so forth in accordance with twist angles determined by a rubbing angle of an orientation layer.

Referring to FIG. 2, the LCD comprises a pair of panels 52 and 53 having common electrodes 50 and segment electrodes 51 respectively; a frit seal 54 for maintaining a constant gap between the panels and fixing the panels 52 and 53; a pair of orientation layers 55 covering the common electrodes 50 and the segment electrodes 51 respectively; and a pair of polarizers 56 and 57 attached or stuck to the outer surface of the panels respectively, the common electrodes and the segment electrodes 50 and 51 being crossed to form a matrix shape.

Further, the segment electrodes 51 are connected to lead patterns 58 extending to outside of the frit seal 54. The outer ends of the lead patterns 58 are connected to a film 60 having a driver chip 59. Also the common electrodes 50 are connected to the driver chip by way of a film. The film has patterns (not shown) of the same pitch as that of the lead patterns connected to the common electrodes 50, and the segment electrodes 51.

When a voltage is applied to the common electrodes 50 and the segment electrodes 51 through the driver chip 59, an electric field is formed on a predetermined pixel (not shown) and the liquid crystal at the portion of the pixel is twisted from which the light from a back light (not shown) to be passed. The polarizers 56 and 57 permit only the twisted lights to pass, and so only the determined pixels can display a picture.

Methods for connecting common electrodes 50 or segment electrodes 51 to the driver chip are proposed and they can be classified into COB (Chip On Board), TAB(Tape Automated Bonding), and COG(Chip On Glass) etc.

In the case of the TAB method, the driver chip 59 is stuck to the film 60 as shown in FIG. 3 and the film 60 has patterns of the same pitch as that of the lead patterns (not shown).

Further, types of connection of the driver chip to the common electrodes 50 and the segment electrodes 51, and it is not necessary to make a distinction between common electrodes 50 and segment electrodes 51. "Electrode(s)" which will be described hereinafter indicate(s) the common electrode(s) 50 or segment electrode(s) 51.

As illustrated in FIG. 4, the patterns 61 are connected to the lead patterns 58. The lead patterns 58 are formed to gather in the pad 62 connected to the film 60 or are formed in a radial shape from the driver chip (not shown).

However, in recent big and compact LCDs, since the electrodes 50 and 51 grow in number and become finer than before, more electrodes should be driven by one driver chip, such that in the case of the radially shaped lead patterns 58, the lead patterns at the outer portion ('outer patterns') become much longer than those at the inner portion ('inner patterns') than before.

Therefore, resistances of the outer patterns are bigger than those of the inner patterns when a signal is applied, so the pixels driven by the outer patterns are driven in lower electric potential than needed. Since the twist angle of the liquid crystal driven in low electric potential is small, so the amount of the back light passing the pixels driven by outer patterns is less than inner patterns. Thus, the pixels driven by the outer patterns are darker than inner patterns thereby causing the display error.

SUMMARY OF THE INVENTION

The present invention has been made with a view to solve the above described problem of the LCD.

It is an object of the present invention to provide an LCD which can reduce display error.

To achieve the above objectives, the present invention provides an LCD having lead patterns of equal length to equalize the resistances of the electrodes.

BRIEF DESCRIPTION OF DRAWINGS

Further objects and other advantages of the invention will become apparent from the following description in conjunction with the attached drawings, in which.

DETAILED DESCRIPTION OF THE INVENTION

Figure 1:
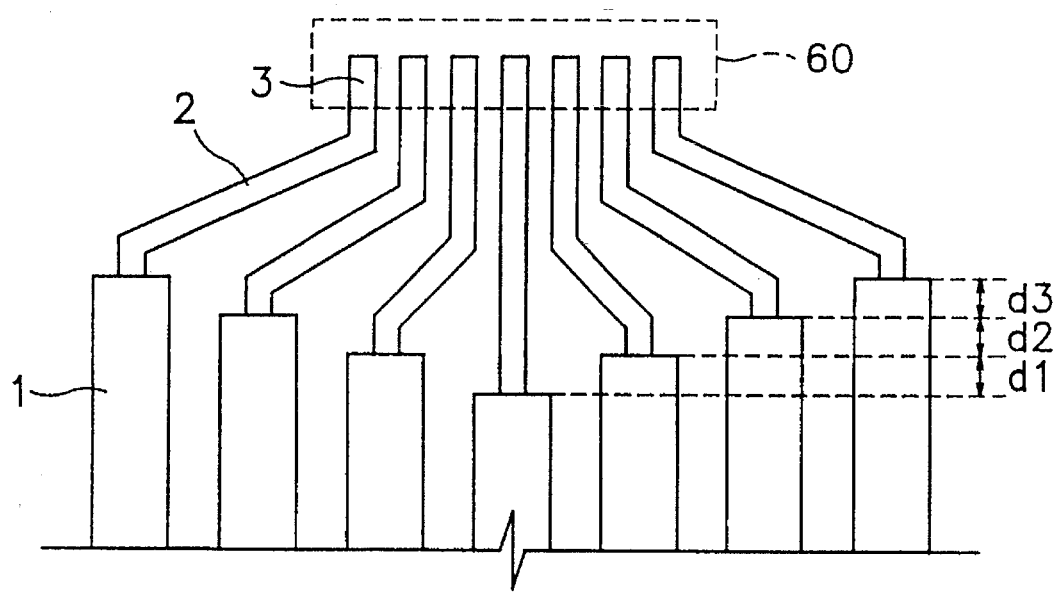
FIG. 1 is a partially enlarged view of an embodiment of lead patterns in accordance with the present invention.
Figure 2:
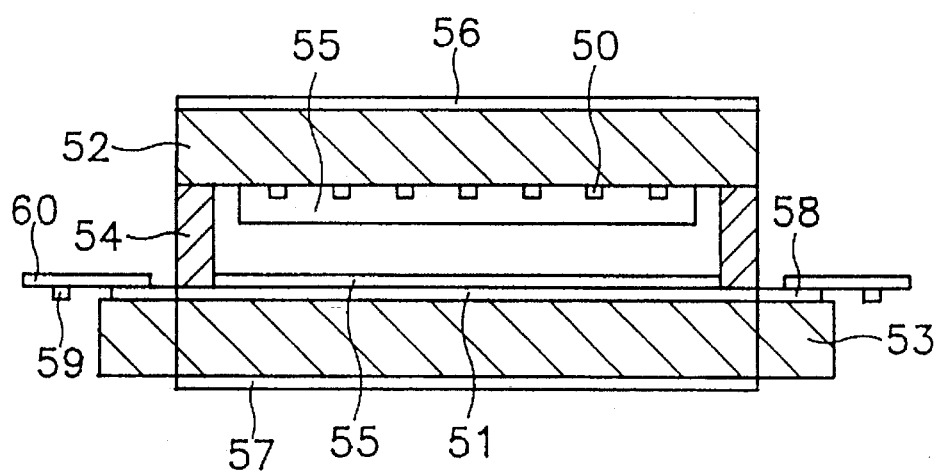
FIG. 2 is a sectional view illustrating a conventional LCD.
Figure 3:
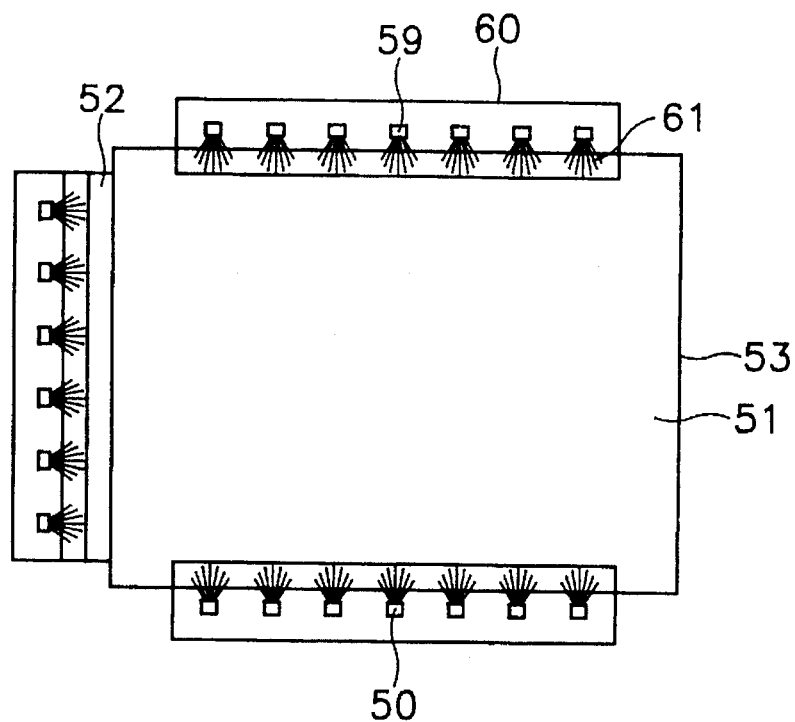
FIG. 3 is a plan view illustrating a driver chip stuck to the LCD in a TAB method.
Figure 4:
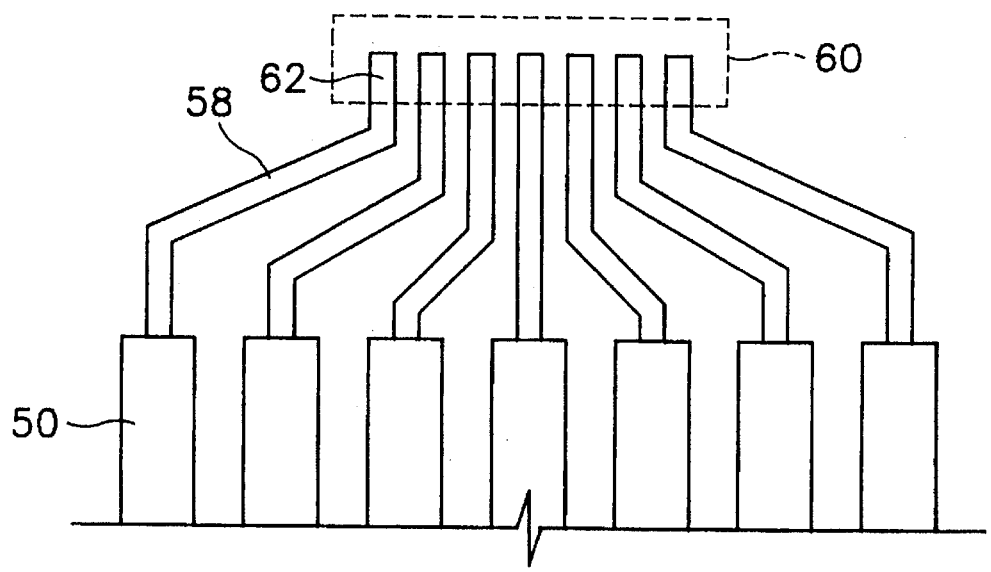
FIG. 4 is a partially enlarged view of lead patterns of the conventional LCD.

Referring to FIG. 1, there is shown an embodiment of lead patterns 2 in accordance with the present invention. The lead patterns 2 in this embodiment are connected to elongated common electrodes or segment electrodes 1 whose lengths are different along a panel, that is, the farther the electrodes are away from the central portion, the more the lengths of the elongated electrodes increase.

When the width and density of the lead patterns 2 are equal, to equalize the resistances of the lead patterns 2, the lengths of the lead patterns 2 should be equal. Thus the lengths of the electrodes 1 should be adjusted for a radial shape of the lead patterns 2.

Namely, the lengths of the electrodes 1 are different by $d_1$, $d_2$, or $d_3$, the differences are the same as the difference of each of the lead patterns 2 caused by using the radial method.

For example, when the difference of the lengths of the neighbouring lead patterns 2 is 0.012 μm, width of one electrode 1 is 0.275 μm and width of one lead pattern 2 is 0.06 μm, the increased resistance of the electrodes 1 caused by the increased length of the lead patterns 2 according to the conventional LCD can be calculated as (1), but according to the present invention it can be expressed as (2).

$$0.021/0.06*12.5 = 4.37(\Omega) \qquad (1)$$

$$0.021/0.275*12.5 = 0.95(\Omega) \qquad (2)$$

Namely, when the lengths of the lead patterns 2 are equalized and the electrodes 1 are elongated a little, the resistances can be reduced, whereby display error of a LCD can be cured remarkably.

Further, in this case, when the widths and densities of each of the lead patterns 2 are equal, the resistances of each of the lead patterns 2 are equal.

Thus, according to the present invention, the display error can be cured and display of a LCD can be clearer than before.

What is claimed is:

1. A liquid crystal display comprising:

a pair of panels having a segment electrode and a common electrode respectively;

a liquid crystal between said panels;

a frit seal for sealing said panels;

a pair of polarizers each attached to an outer surface of a different end of said panels; and lead patterns connected to the electrodes, wherein the lead patterns are of equal length to ensure that resistances of the lead patterns are uniform, and wherein the electrodes are adapted to accommodate the lead patterns.

2. A liquid crystal display as claimed in claim 1 wherein each of said electrodes has a different length.

3. A liquid crystal display as claimed in claim 2, wherein the lengths of said electrodes increases from a center of said panels to both ends of the said panels.

* * * * *